(12) United States Patent
Sandholzer et al.

(10) Patent No.: US 10,934,422 B2
(45) Date of Patent: Mar. 2, 2021

(54) POLYPROPYLENE COMPOSITIONS FOR A LAYER ELEMENT

(71) Applicants: BOREALIS AG, Vienna (AT); ISOVOLTAIC SOLINEX GmbH, Lebring (AT)

(72) Inventors: Martina Sandholzer, Linz (AT); Bert Broeders, Beringen (BE); Werner Krumlacher, Wolfsberg (AT); Harald Muckenhuber, Lebring (AT); Michaela Plank, Graz (AT); Verena Schenk, Koflach (AT); Klaus Bernreitner, Linz (AT)

(73) Assignee: BOREALIS AG, Vienna (AT)

( * ) Notice: Subject to any disclaimer, the term of this patent is extended or adjusted under 35 U.S.C. 154(b) by 62 days.

(21) Appl. No.: 15/771,910

(22) PCT Filed: Jul. 29, 2016

(86) PCT No.: PCT/EP2016/068152
§ 371 (c)(1),
(2) Date: Apr. 27, 2018

(87) PCT Pub. No.: WO2017/071847
PCT Pub. Date: May 4, 2017

(65) Prior Publication Data
US 2019/0382567 A1    Dec. 19, 2019

(30) Foreign Application Priority Data
Oct. 28, 2015 (EP) ..................... 15191896

(51) Int. Cl.
| | | |
|---|---|---|
| *C08L 23/12* | (2006.01) | |
| *C08K 3/013* | (2018.01) | |
| *C08L 23/16* | (2006.01) | |
| *C08L 51/06* | (2006.01) | |
| *C08K 3/24* | (2006.01) | |

(52) U.S. Cl.
CPC ............ *C08L 23/12* (2013.01); *C08K 3/013* (2018.01); *C08L 23/16* (2013.01); *C08K 3/24* (2013.01); *C08L 51/06* (2013.01); *C08L 2201/56* (2013.01); *C08L 2205/025* (2013.01); *C08L 2207/04* (2013.01)

(58) Field of Classification Search
CPC ..... H01L 31/0481; H01L 31/049; C08K 3/34; C08K 3/22; C08K 3/013; C08L 23/14; C08L 23/12; C08L 51/06; C08L 23/16; C08L 23/0815; Y02E 10/50
See application file for complete search history.

(56) References Cited

U.S. PATENT DOCUMENTS

| | | |
|---|---|---|
| 4,107,414 A | 8/1978 | Giannini et al. |
| 4,186,107 A | 1/1980 | Wagner |
| 4,226,963 A | 10/1980 | Giannini et al. |
| 4,347,160 A | 8/1982 | Epstein et al. |
| 4,382,019 A | 5/1983 | Greco |
| 4,435,550 A | 3/1984 | Ueno et al. |
| 4,465,782 A | 8/1984 | Mckenzie |
| 4,472,524 A | 9/1984 | Albizzati |
| 4,473,660 A | 9/1984 | Albizzati et al. |
| 4,522,930 A | 6/1985 | Albizzati et al. |
| 4,530,912 A | 7/1985 | Pullukat et al. |
| 4,532,313 A | 7/1985 | Matlack |
| 4,560,671 A | 12/1985 | Gross et al. |
| 4,581,342 A | 4/1986 | Johnson et al. |
| 4,657,882 A | 4/1987 | Karayannis et al. |
| 5,539,067 A | 7/1996 | Parodi et al. |
| 5,618,771 A | 4/1997 | Parodi et al. |
| 2007/0059545 A1* | 3/2007 | Emiliani et al. ........ C08L 23/12 428/515 |
| 2015/0027516 A1* | 1/2015 | Rummens ............... B32B 27/32 136/251 |
| 2017/0077333 A1* | 3/2017 | Piel et al. ............... B32B 27/32 |

FOREIGN PATENT DOCUMENTS

| | | |
|---|---|---|
| CN | 1871293 A | 11/2006 |
| CN | 102449047 A | 5/2012 |
| CN | 104272467 A | 1/2015 |
| CN | 106255719 A | 5/2015 |
| EP | 0045977 A2 | 2/1982 |
| EP | 0045975 A2 | 3/1982 |
| EP | 0045976 A2 | 3/1982 |
| EP | 491566 A2 | 9/1992 |
| EP | 586390 B1 | 3/1994 |
| EP | 591224 B1 | 4/1994 |

(Continued)

OTHER PUBLICATIONS

Japanese Office action for Patent Application No. 2018-541493, dated May 7, 2019.
Hideki Nakajima, et al. "Technology of Evaluating Performance of Plastic Molded Product", Research Paper of Industrial Technology Center of Ibaraki Prefecture, Japan, 1992, vol. 21, 129th-133rd.
Zweifel, et al., "Plastics Additives Handbook", 5th Edition, Department of Materials, Institute of Polymers, 2001.

(Continued)

*Primary Examiner* — Nathan M Nutter

(74) *Attorney, Agent, or Firm* — Tarolli, Sundheim, Covell & Tummino LLP

(57) ABSTRACT

The present invention relates to a polymer composition for a layer element, to a use of the polypropylene composition for producing at least one layer of a layer element, preferably of a layer element of an article, preferably of a photovoltaic module, to a layer element, preferably a layer element of an article, preferably of a photovoltaic module, wherein said layer element comprises at least one layer comprising the polymer composition, as well as to an article, which is preferably a photovoltaic module.

12 Claims, 1 Drawing Sheet

(56) References Cited

FOREIGN PATENT DOCUMENTS

| | | |
|---|---|---|
| EP | 0887379 A1 | 12/1998 |
| EP | 1956660 A1 | 8/2008 |
| EP | 2277694 A1 | 1/2011 |
| EP | 2423257 A1 | 2/2012 |
| EP | 2610271 A1 | 7/2013 |
| EP | 2853563 A1 | 4/2015 |
| WO | 87/07620 A1 | 12/1987 |
| WO | 92/12182 A1 | 7/1992 |
| WO | 92/19653 A1 | 11/1992 |
| WO | 92/19658 A1 | 11/1992 |
| WO | 92/19659 A1 | 11/1992 |
| WO | 92/21705 A1 | 12/1992 |
| WO | 93/11165 A1 | 6/1993 |
| WO | 93/11166 A1 | 6/1993 |
| WO | 93/19100 A1 | 9/1993 |
| WO | 95/32994 A1 | 12/1995 |
| WO | 97/36939 A1 | 10/1997 |
| WO | 98/12234 A1 | 3/1998 |
| WO | 99/24478 A1 | 5/1999 |
| WO | 99/24479 A1 | 5/1999 |
| WO | 99/33842 A1 | 7/1999 |
| WO | 00/68315 A1 | 11/2000 |
| WO | 2003/000754 A1 | 1/2003 |
| WO | 2003/000755 A2 | 1/2003 |
| WO | 2003/000756 A1 | 1/2003 |
| WO | 2003/000757 A | 1/2003 |
| WO | 2004/000899 A1 | 12/2003 |
| WO | 2004/029112 A1 | 4/2004 |
| WO | 2004/111095 A1 | 12/2004 |
| WO | 2005/040270 A1 | 5/2005 |
| WO | 2009/151029 A1 | 12/2009 |
| WO | 2010/142540 A1 | 12/2010 |
| WO | 2012/007430 A1 | 1/2012 |
| WO | 2012/043248 A1 | 4/2012 |
| WO | 2013/135349 A1 | 9/2013 |
| WO | 2015/090594 A1 | 6/2015 |
| WO | 2015/173175 A1 | 11/2015 |

OTHER PUBLICATIONS

Juergen Jung, et al., Email conversation RE: DTI measurement by TMA Re: Einlaudung: measurement of DTI-61730/backsheet—3rd meeting—Preparation of Round-Robin Test, Feb. 4, 2015.
"Catalloy TPO Resins", Lyondellbasell, Oct. 2013.
Product Selection Guide—EAI, "Catalloy TPO RESINS for Compounders", Lyondellbasell, Sep. 2015.
Office action for Chinese Patent Application No. 2020022801634560, dated Mar. 4, 2020.
Third Party Observation for application No. EP20160745718 dated Jan. 27, 2020.
Third Party Observation for application No. EP20160745718 dated Aug. 5, 2019.
European Office Action for Application No. 16 745 718.3-1102 dated May 20, 2020.

* cited by examiner

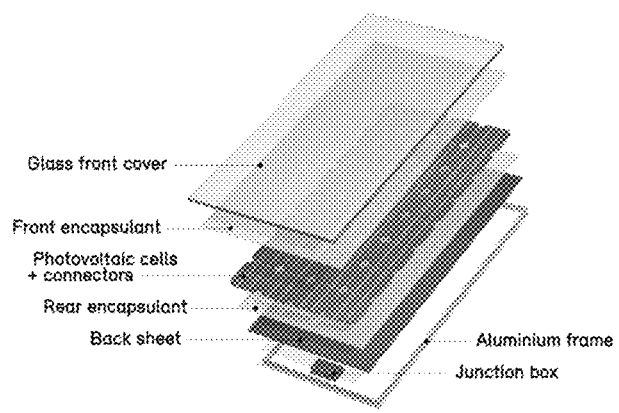

POLYPROPYLENE COMPOSITIONS FOR A LAYER ELEMENT

The present invention relates to a polymer composition for a layer element, to a use of the polypropylene composition for producing at least one layer of a layer element, preferably of a layer element of a photovoltaic module, to a layer element, preferably a layer element of a photovoltaic module, wherein said layer element comprises at least one layer comprising the polymer composition, as well as to a photovoltaic module comprising at least one photovoltaic element and at least one layer element of the invention.

BACKGROUND ART

Photovoltaic modules, also known as solar cell modules, produce electricity from light and are used in various kind of applications as well known in the field. The type of the photovoltaic module can vary. The modules have typically a multilayer structure, i.e. several different layer elements which have different functions. The layer elements of the photovoltaic module can vary with respect to layer materials and layer structure. The final photovoltaic module can be rigid or flexible.

The rigid photovoltaic module can for example contain a rigid protective front layer element, such as a glass element, front encapsulation layer element, a photovoltaic element, rear encapsulation layer element, a protective back layer element, which is also called a backsheet layer element and which can be rigid or flexible; and optionally e.g. an aluminium frame.

In flexible modules all the above elements are flexible, whereby the protective front layer element can be e.g. a fluorinated layer made from polyvinylfluoride (PVF) or polyvinylidenefluoride (PVDF) polymer, and the backsheet layer element is typically a polymeric layer element.

The above exemplified layer elements can be monolayer or multilayer elements. Moreover, there may be adhesive layer(s) between the layers of an element or between the different layer elements.

Backsheet layer element may contain pigmented layer(s). Backsheet layer element functions typically as an insulation element. However, also photovoltaic modules with conductive backsheet layer element exist, depending on the type of the photovoltaic module.

All said terms have a well-known meaning in the art.

The commercially available prior art backsheet layer is typically a multilayer structure containing e.g. a layer of a fluorinated polymer, e.g. PVF or PVDF, polyamide or polyester. These solutions are costly and many of them have also limited insulation resistance, are easily hydrolysed and give rather high water vapour transmission rates. To compensate the above drawbacks, elements with multilayer structures, typically provided also with adhesive layer(s) between the layers, are needed. The multilayer structures complicate the manufacturing processes and also generate a risk for delamination when in use.

EP2277694 describes a photovoltaic module comprising a backsheet element which is a multilayer element wherein the protective layer comprises a flexible blend of polypropylene components. The polypropylene components in examples are commercial Hifax CA 10 A and Hifax CA 60 of LyondellBasell which according to public datasheet of the producer company have a Melting temperature 142° C. and vicat softening temperature of 60° C. and, resp., 56° C. (A50 (50° C./h 10 N)).

There is a continuous need for new polymer compositions for different type of layer element(s) to meet the various demands required in the growing and further developing layer element(s), e.g. for packaging film or photovoltaic module industry. For instance, the technology of the photovoltaic modules is still developing considerably and there is a continuous need for different solutions for layer materials to meet the various demands in photovoltaic module field.

THE FIGURE

The FIGURE illustrates schematically one example of a photovoltaic module of the invention.

THE DESCRIPTION OF THE INVENTION

Accordingly, the present invention is directed to a polypropylene composition for a layer element comprising 0 to 60 wt % of the heterophasic copolymer of propylene (A), which has a Vicat softening temperature (Vicat A) of at least 90° C. (according to ASTM D 1525, method A, 50° C./h, 10N) and which comprises a polypropylene matrix component (a1) and an elastomeric propylene copolymer component (a2) which is dispersed in said polypropylene matrix (a1), 10 to 85 wt % of the heterophasic copolymer of propylene (B), which is different from the heterophasic copolymer of propylene (A) and has a Vicat softening temperature (Vicat A) of at least 90° C. (according to ASTM D 1525, method A, 50° C./h, 10N) and which comprises a polypropylene matrix component (b1) and an elastomeric propylene copolymer component (b2) which is dispersed in said polypropylene matrix (b1), 10 to 45 wt % of an inorganic filler, optionally one or both of a plastomer or an adhesive polymer, each 0 to 30 wt %, and 0.3 to 5 wt % of additives other than the inorganic filler;

based on the total amount (100 wt %) of the polypropylene composition, as defined below or in claims.

The "heterophasic copolymer of propylene (A) and, respectively, (B)" is referred herein also as "PP copolymer (A) and, respectively, (B)". The "polypropylene matrix component (a1) and, respectively, (b1)" is referred herein also as "matrix component (a1) and, respectively, (b1)".

The "elastomeric propylene copolymer component (a2) and, respectively, (b2)" is referred herein also as "elastomeric component (a2) and, respectively, (b2)".

The heterophasic copolymer of propylene (B) is different from the heterophasic copolymer of propylene (A).

Generally, a "heterophasic copolymer of propylene" (as used herein in connection to PP copolymer (A) and, respectively, (B)) is a propylene copolymer comprising a propylene homo polymer or propylene random copolymer matrix component (1) and an elastomeric copolymer component (2) of propylene with one or more of ethylene and/or C4-C8 alpha olefin comonomers, wherein the elastomeric (amorphous) copolymer component (2) is (finely) dispersed in said propylene homo or random copolymer matrix polymer (1).

As well known "comonomer" refers to copolymerisable comonomer units.

Surprisingly, the composition of the invention provides an excellent combination of mechanical and long term stability properties which makes the composition of the invention highly suitable for a layer(s) of a layer element, preferably of a multilayer element. Also the water vapour transmission rate and electrical properties make the composition of the invention as highly feasible polymer material for at least one layer of a layer element of a photovoltaic module.

The composition of the invention also contributes to one, more or all of the following properties, in any order and in any combination:

Sufficient stiffness expressed e.g. as tensile modulus

Sufficient ductility and Crack resistance expressed e.g. as Thermal Cycling Test (TCT test)

Good interlayer adhesion between the layers of a multilayer element. Preferably the breakage of the material is >50 N/cm tensile force at 23° C. when trying to separate the layers of a three layer element, when each layer comprises the polymer composition, when measured according to method as described below under Determination methods, preferably there is no layer separation at all Good adhesion between two different (multi)layer elements, like between rear encapsulation layer element and backsheet layer element Good adhesion of PP to EVA, preferably EVA adhesion is >30 N/cm at 23° C., when using EVA Type F806 from First EVA, when measured according to method as described below under Determination methods Long term stabilization against UV radiation and thermal degradation Long term stabilization against hydrolytic degradation Low water vapour transition System voltage is preferably of >1000 V AC at a thickness of 300 μm of a three layer element, when each layer comprises the polymer composition of the invention, when using a conventional determination method High solar reflectance.

In a preferable embodiment, the polypropylene composition is selected from 1) a polypropylene composition (CA), which comprises
   5 to 50 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises a polypropylene matrix component (a1) and an elastomeric propylene copolymer component (a2) which is dispersed in said polypropylene matrix (a1), and
   20 to 60 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
   a polypropylene matrix component (b1) and
   an elastomeric propylene copolymer component (b2) which is dispersed in said polypropylene matrix (b1),
   10 to 40 wt % of an inorganic filler,
   0 to 30 wt % of an plastomer, and
   0.3 to 5 wt % of an additive(s) other than the inorganic filler,
   based on the total amount (100 wt %) of the polypropylene composition;
   wherein the XCS of heterophasic copolymer of propylene (B) is higher than the XCS of heterophasic copolymer of propylene (A); or 2) a polypropylene composition (CB), which comprises
   0 to 60 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
   a polypropylene matrix component (a1) and
   an elastomeric propylene copolymer component (a2) which is dispersed in said polypropylene matrix (a1), and
   15 to 85 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
   a polypropylene matrix component (b1) and
   an elastomeric propylene copolymer component (b2) which is dispersed in said polypropylene matrix (b1),
   15 to 45 wt % of an inorganic filler,
   0 to 30 wt % of an adhesive polymer,
   0 to 30 wt % of a plastomer, and
   0.3 to 5.0 wt % of an additive(s) other than the inorganic filler;
   based on the total amount (100 wt %) of the polypropylene composition;
   wherein, if the heterophasic copolymer of propylene (A) is present, then the XCS of heterophasic copolymer of propylene (B) is higher than the XCS of heterophasic copolymer of propylene (A).

The XCS fraction of PP copolymer (A or, respectively, B) is regarded herein as the elastomeric component (a2 or, respectively, b2), since the amount of XCS fraction in the matrix component is conventionally markedly lower. For instance, in case the matrix component (a1 or, respectively, b1) is a homopolymer of propylene, then the amount of the xylene cold soluble (XCS) fraction (amorphous fraction) (wt %) of the heterophasic copolymer of propylene (A or, respectively, B) is understood in this application also as the amount of the elastomeric propylene copolymer component (a2 or, respectively, b2) present in the PP copolymer (A or, respectively, B).

The property balance makes the composition of the invention highly feasible for a film layer(s), particularly for a film layer(s) of a multilayer element.

Accordingly the invention further provides a use of the polypropylene composition of the invention for producing at least one layer of a layer element, preferably of a multilayer element.

Further the invention provides a layer element, wherein said layer element comprises at least one layer comprising the polymer composition.

Accordingly, the layer element of the invention can be a monolayer element or a multilayer element. In case the layer element is a monolayer element, then the "at least one" layer comprises, preferably consists of, the composition of the invention.

Moreover, the mono- or multilayer element of the invention may be part of an assembly, like photovoltaic module, comprising further mono- and/or multilayer element(s) with different functionality and arranged in a desired layered multi-element structure, wherein one or more of the further mono- and/or multilayer element(s) may also comprise one or more layers of the polymer composition of the invention.

The invention further provides an article which comprises a layer element, wherein said layer element comprises at least one layer comprising the polymer composition of the invention. The preferred article is a photovoltaic module as describe above, below or in claims, comprising the layer element of the invention.

The layer element of the invention is preferably a layer element of a photovoltaic module, preferably of a multilayer element of a photovoltaic module, comprising at least one layer comprising the polymer composition.

Preferably the layer element is a multilayer element, preferably a multilayer element of a photovoltaic module, wherein said multilayer element comprises at least one layer comprising, preferably consisting of, the polymer composition of the invention.

The expression "at least one layer" of a layer element means that in case of a multilayer element said element can comprise two or more layers, wherein at least one layer comprises the polymer composition of the invention. The other layer(s) of such multilayer element may comprise different layer material(s) or may comprise the polymer composition of the invention.

Herein the definitions "layer element of the invention comprising (or which comprises) at least one layer comprising (or which comprises) the polymer composition of the invention" and "at least one layer of the layer element of the invention comprising (or which comprises) the polymer composition of the invention" are used herein interchangeably to refer the layer(s) and/or the layer element of the invention.

In one embodiment the at least one layer of the layer element comprises the polypropylene composition (CA) as defined above, below or in claims.

In an alternative embodiment the at least one layer of the layer element comprises the polypropylene composition (CB) as defined above, below or in claims.

Moreover, the (multi)layer element of the invention may be part of an assembly, like photovoltaic module, comprising several (multi)layer elements with different functionality and arranged in a desired layered multi-element structure, wherein not only one, but also two or more of the (multi) layer elements may comprise one or more layers of the polymer composition of the invention. Accordingly, in case of an assembly with two or more (multi)layer elements, then layer(s) of the polymer composition of the invention may be present in one or more of the (multi)layer elements.

Furthermore, the invention provides a photovoltaic module comprising at least one photovoltaic element and at least one layer element which comprises at least one layer comprising, preferably consisting of, said polypropylene composition of the invention.

Preferably the photovoltaic module comprises, in the given order, a protective front layer element, such as a glass element, front encapsulation layer element, a photovoltaic element, rear encapsulation layer element, a protective back layer element, which is herein also called a backsheet layer element, wherein at least one or more, or all, of said front encapsulation layer element, rear encapsulation layer element or backsheet layer element, preferably at least said backsheet layer element, comprises the layer element of the invention comprising at least one layer, which comprises the polymer composition of the invention.

Preferably the PV module comprises a backsheet multilayer element comprising a first layer/second layer/third layer-element, wherein the first layer and the third layer comprise, preferably consist of, the polypropylene composition (CB) as defined above, below or in claims; and the second layer comprises, preferably consists of, the polypropylene composition (CA) as defined above, below or in claims.

The total thickness of the layer element of the invention is, only as an example, i.e. without limiting to, typically up to 700, like 90 to 700, suitably 140 to 500, such as 240 to 400 μm.

The "photovoltaic element" means that the element has photovoltaic activity. The photovoltaic element can be e.g. an element of photovoltaic cell(s), which has a well known meaning in the art. Silicon based material, e.g. crystalline silicon, is a non-limiting example of materials used in photovoltaic cell(s). Crystalline silicon material can vary with respect to crystallinity and crystal size, as well known to a skilled person. Alternatively, the photovoltaic element can be a substrate layer on one surface of which a further layer or deposit with photovoltaic activity is subjected, for example a glass layer, wherein on one side thereof an ink material with photovoltaic activity is printed, or a substrate layer on one side thereof a material with photovoltaic activity is deposited. For instance, in well-known thin film solutions of photovoltaic elements e.g. an ink with photovoltaic activity is printed on one side of a substrate, which is typically a glass substrate. Accordingly, the at least one layer of the invention can also be a layer in any layer element of a thin film based photovoltaic module.

The photovoltaic element is most preferably an element of photovoltaic cell(s).

"Photovoltaic cell(s)" means herein a layer element(s) of photovoltaic cells, as explained above, together with connectors.

Accordingly, the polymer composition of the invention enables, if desired, to use simpler layer elements in articles comprising layered structure, or articles of layered structures, like photovoltaic modules. I.e. the layer elements can have less layers and/or thinner layers, whereby the thickness of the photovoltaic module can be reduced.

Moreover, the formed layer, e.g. laminate, of the polypropylene composition has minimised (typically 0.5% tested at 150° C. for 30 min) or no shrinkage.

Furthermore, the composition of the invention provides a layer material which is highly feasible for the lamination or coextrusion process of the different layers of a multilayer element, depending on the desired end application.

As said the polypropylene composition has also highly advantageous temperature and mechanical stability which can be demonstrated with any of the known "Tensile, Adhesion and Thermal Cycling Test" (TCT), Damp Heat Test (DHT), Pressure Cooker Test (PCT) and/or Relative Temperature Index (RTI) test(s)) at end use applications which can prolong the working life of an end article, like a PV module.

As known, fluoride containing polymer material can be undesirable for many end applications. Preferably, the polypropylene composition of the invention enables to produce backsheet elements of a photovoltaic module, wherein the layers of the backsheet element are free from fluoride containing polymer, such as layers of polyvinylidene fluoride polymer or of polyvinylfluoride polymer. Thus preferably the layer of the backsheet monolayer element or the layers of the backsheet multilayer element of the photovoltaic module of the invention is/are free from fluoride containing polymer.

Moreover, due to excellent mechanical and thermal properties, the composition of the invention enables to use multilayer elements in many end applications, like photovoltaic modules in solar applications, which elements consist of polyolefin based layers. Such polyolefin polymer(s) can comprise e.g. one or more monomers selected from ethylene and/or alpha-olefins, typically C3- to C10-alphaolefins. Additionally, further functional units can be incorporated to the polyolefin e.g. by grafting or by copolymerising. For instance, polar functional groups, such as maleic anhydride (MAH), can be grafted to such a polyolefin to form functional polymers thereof.

The composition of the invention, the PP copolymer (A) and, respectively, (B) of the invention, the at least one layer, including the preferable layer of the mono- or multilayer element, like backsheet element of a photovoltaic module, and the article, preferably the photovoltaic module of the invention, are described below and claims with further details, preferred embodiments, ranges and properties, which preferred embodiments, ranges and properties can be in any combination and combined in any order.

Polypropylene Composition of the Invention

Accordingly, in a preferable embodiment, the polypropylene composition of the invention is selected from 1) a polypropylene composition (CA), which comprises
   5 to 50 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises a polypropylene matrix component (a1) and an elastomeric propylene copolymer component (a2) which is dispersed in said polypropylene matrix (a1), and
   20 to 60 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
   a polypropylene matrix component (b1) and
   an elastomeric propylene copolymer component (b2) which is dispersed in said polypropylene matrix (b1),
   10 to 40 wt % of an inorganic filler,
   0 to 30 wt % of an plastomer, and
   0.3 to 5 wt % of an additive(s) other than the inorganic filler,
   based on the total amount (100 wt %) of the polypropylene composition;
   wherein the XCS of heterophasic copolymer of propylene (B) is higher than the XCS of heterophasic copolymer of propylene (A); or 2) a polypropylene composition (CB), which comprises
   0 to 60 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
   a polypropylene matrix component (a1) and
   an elastomeric propylene copolymer component (a2) which is dispersed in said polypropylene matrix (a1), and
   15 to 85 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
   a polypropylene matrix component (b1) and
   an elastomeric propylene copolymer component (b2) which is dispersed in said polypropylene matrix (b1),
   15 to 45 wt % of an inorganic filler,
   0 to 30 wt % of an adhesive polymer,
   0 to 30 wt % of a plastomer, and
   0.3 to 5.0 wt % of an additive(s) other than the inorganic filler;
   based on the total amount (100 wt %) of the polypropylene composition;
   wherein, if the heterophasic copolymer of propylene (A) is present, then the XCS of heterophasic copolymer of propylene (B) is higher than the XCS of heterophasic copolymer of propylene (A).

The polypropylene composition (CA) or, respectively, (CB) of the invention preferably has an $MFR_2$ of 1.0 to 25.0, preferably of 2.0 to 20, preferably of 3 to 15, preferably of 4 to 15, g/10 min, when measured according to ISO 1133 (at 230° C. with 2.16 kg load) as defined below under the Determination methods. The polypropylene composition (CA) has more preferably $MFR_2$ of 3 to 10 g/10 min. The polypropylene composition (CB) has more preferably $MFR_2$ of 3 to 15 g/10 min.

The polypropylene composition (CA) or, respectively, (CB) of the invention preferably has a Xylene cold soluble (XCS) content in amount of 5 to 40, preferably 5 to 35%, when measured as defined below under the Determination methods.

The XCS of the polypropylene composition (CA) is more preferably of 10 to 40, preferably 15 to 35%, preferably 15 to 30,%. The XCS of the polypropylene composition (CB) is more preferably of 5 to 35, preferably 12 to 35%.

The polypropylene composition (CA) or, respectively, (CB) of the invention preferably has a Vicat softening temperature (Vicat A) of 100 to 200, preferably 105 to 165, more preferably of 110 to 165, ° C., when measured as described below under Determination methods. The Vicat A of the polypropylene composition (CA) is preferably of 110 to 155, preferably of 110 to 150, preferably of 112 to 150, 130 to 150, ° C. The Vicat A of the polypropylene composition (CB) is preferably of 120 to 160, preferably of 120 to 155, ° C.

The polypropylene composition (CA) or, respectively, (CB) of the invention preferably has a Tensile modulus of at least 900, preferably of 1000 to 3000, preferably of 1000 to 2700, MPa, when measured from an injection moulded test specimen as defined below under the Determination methods. Said Tensile modulus of the polypropylene composition (CA) is preferably of 1000 to 2700 MPa. Said Tensile modulus of the polypropylene composition (CB) is preferably of 1000 to 2000 MPa.

The polypropylene composition (CA) or, respectively, (CB) of the invention preferably has a Strain at break of more than 60, preferably of 65 to 800, preferably of 65 to 700, preferably 65 to 600, preferably 65 to 500%, when measured from an injection moulded test specimen as defined below under the Determination methods. Said Strain at break of the polypropylene composition (CA) is preferably of 100 to 700, preferably 100 to 600, preferably 100 to 500,%. Said Strain at break of the polypropylene composition (CB) is preferably of 65 to 500%.

The polypropylene composition (CA) or, respectively, (CB) of the invention preferably has a Tensile modulus of at least 800 preferably of 850 to 2000, MPa, when measured in machine direction from 200 µm monolayer cast film as defined below under the Determination methods.

The polypropylene composition (CA) or, respectively, (CB) of the invention preferably has a Strain at break of at least 620, preferably of 630 to 1500, more preferably of 650 to 1200, %, when measured from 200 μm monolayer cast film as defined below under the Determination methods.

The coextruded three layer film of the polypropylene composition of the invention preferably has a Tensile modulus in extrusion (machine) direction at room temperature (30° C.) of at least 1000 MPa, preferably of at least 1200 MPa, more preferably at least 1500 MPa, the upper limit being 2400 MPa, when measured according to ISO 527 from a coextruded three layer film as defined in "Tensile, Adhesion and Thermal Cycling Test (TCT) using Three-layer Film Sample preparations" below under the Determination methods.

The coextruded three layer film of the polypropylene composition of the invention preferably has a Tensile modulus in transfer direction at room temperature (30° C.) of at least of 650 MPa, preferably of at least 700 MPa, preferably of at least 900 MPa, more preferably at least 1100 MPa, the upper limit being 2400 MPa, when measured according to ISO 527 from a coextruded three layer film as defined below in "Tensile, Adhesion and Thermal Cycling Test (TCT) using Three-layer Film Sample preparations" under the Determination methods.

The coextruded three layer film of the polypropylene composition of the invention preferably has a Tensile modulus in extrusion (machine) direction at 115° C. of at least 200 MPa, of preferably at least 300 MPa, preferably of at least 400 MPa, preferably of at least 450 MPa, more preferably at least 550 MPa, the upper limit being 800 MPa, when measured according to ISO 527 from a coextruded three layer film as defined below in "Tensile, Adhesion and Thermal Cycling Test (TCT) using Three-layer Film Sample preparations" under the Determination methods.

The coextruded three layer film of the polypropylene composition of the invention preferably has a Tensile modulus in transverse direction at 115° C. of at least 100 MPa, preferably of at least 200 MPa, preferably of at least 300 MPa, preferably of at least 350 MPa, more preferably of at least 400 MPa, the upper limit being 800 MPa, when measured according to ISO 527 from a coextruded three layer film as defined below in "Tensile, Adhesion and Thermal Cycling Test (TCT) using Three-layer Film Sample preparations" under the Determination methods.

The polypropylene composition (CA) or, respectively, (CB) of the invention preferably has an Impact strength at −20° C. of 1 to 20, preferably of 1.5 to 15, $kJ/m^2$, when measured as defined below under the Determination methods.

The optional inorganic filler of the polymer composition is preferably talc or pigment.

Accordingly, in one preferable embodiment, the polypropylene composition of the invention comprises, 1) a polypropylene composition (CA), which comprises
   5 to 50 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises a polypropylene matrix component (a1) and
   an elastomeric propylene copolymer component (a2) which is dispersed in said polypropylene matrix (a1), and
   20 to 60 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
   a polypropylene matrix component (b1) and
   an elastomeric propylene copolymer component (b2) which is dispersed in said polypropylene matrix (b1),
   10 to 40 wt % of an inorganic filler,
   0 to 30 wt % of an plastomer, and
   0.3 to 5 wt % of an additive(s) other than the inorganic filler,
   based on the total amount (100 wt %) of the polypropylene composition;
   wherein the XCS of heterophasic copolymer of propylene (B) is higher than the XCS of heterophasic copolymer of propylene (A), as defined above, below or in claims.

Accordingly, in another equally preferable embodiment, the polypropylene composition of the invention comprises, 2) a polypropylene composition (CB), which comprises
   0 to 60 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
   a polypropylene matrix component (a1) and
   an elastomeric propylene copolymer component (a2) which is dispersed in said polypropylene matrix (a1), and
   15 to 85 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
   a polypropylene matrix component (b1) and
   an elastomeric propylene copolymer component (b2) which is dispersed in said polypropylene matrix (b1),
   15 to 45 wt % of an inorganic filler,
   0 to 30 wt % of an adhesive polymer,
   0 to 30 wt % of a plastomer, and
   0.3 to 5.0 wt % of an additive(s) other than the inorganic filler;
   based on the total amount (100 wt %) of the polypropylene composition;
   wherein, if the heterophasic copolymer of propylene (A) is present, then the XCS of heterophasic copolymer of propylene (B) is higher than the XCS of heterophasic copolymer of propylene (A), as defined above, below or in claims.

Preferable subgroups of a polypropylene composition (CA):

The polypropylene composition (CA) preferably comprises
   5 to 50, preferably 10 to 40, more preferably 15 to 35, more preferably 20 to 33, wt % of the heterophasic copolymer of propylene (A),
   25 to 70, preferably 30 to 70, more preferably 35 to 65, more preferably 35 to 45, wt % of the heterophasic copolymer of propylene (B),
   10 to 40, preferably 10 to 35, more preferably 15 to 30, more preferably 17 to 30, wt % of the inorganic filler,
   0 to 30 wt % of a plastomer, and
   0.3 to 5.0, preferably 0.5 to 3.0, wt % of additives, preferably at least an antioxidant(s) and UV-stabiliser(s);

based on the total amount (100 wt %) of the polypropylene composition.

In case the polypropylene composition (CA) comprises a plastomer, then the amount of the plastomer is preferably 3 to 20, more preferably 4 to 17, more preferably 4 to 15, wt %, based on the total amount (100 wt %) of the polypropylene composition.

More preferably, the polypropylene composition (CA) comprises the plastomer as defined above. The plastomer is preferably a copolymer of ethylene with at least one C3 to C10 alpha-olefin. The plastomer has preferably one or all, preferably all, of the below properties
- a density of 860 to 910, preferably 860 to 900, kg/m³,
- $MFR_2$ of 0.1 to 50, preferably 0.2 to 40, (190° C., 2.16 kg), and/or
- the alpha-olefin comonomer is octene.

The plastomer is preferably produced using a metallocene catalyst, which term has a well-known meaning in the prior art. The suitable plastomers are commercially available, e.g. plastomer products under tradename QUEO™, supplied by Borealis, or Engage™, supplied by ExxonMobil.

The inorganic filler in polypropylene composition (CA) is preferably talc. Talc is available e.g. as commercial talc product. Any carrier medium, e.g. carrier polymer, is calculated to the amount of the inorganic filler, e.g. talc product.

Preferable subgroups of a polypropylene composition (CB):

The polypropylene composition (CB) preferably comprises
- 0 to 60, preferably 0 to 55, preferably 0 to 50, more preferably 0 to 45, wt % of the heterophasic copolymer of propylene (A),
- 10 to 60, preferably 15 to 60, more preferably 18 to 55, wt % of the heterophasic copolymer of propylene (B),
- 15 to 45, preferably 15 to 40, preferably 20 to 40, more preferably 25 to 40, more preferably 30 to 40 wt % of the inorganic filler,
- 0 to 30 wt % of an adhesive polymer,
- 0 to 30 wt % of a plastomer, and
- 0.3 to 5.0, preferably 0.5 to 3.0, wt % of additives, preferably at least an antioxidant(s) and UV-stabiliser(s);

based on the total amount (100 wt %) of the polypropylene composition.

Alternatively, if the heterophasic copolymer of propylene (A) is present in the polypropylene composition (CB), then the amount of the heterophasic copolymer of propylene (A) is more preferably 3 to 45, preferably 5 to 40, preferably 10 to 35, more preferably 15 to 30, wt %.

The polypropylene composition (CB) comprises preferably an adhesive polymer. The amount of the adhesive polymer is preferably 3 to 25, more preferably 5 to 20, more preferably 4 to 15, wt %, based on the total amount (100 wt %) of the polypropylene composition. The adhesive polymer is preferably a functionalised polypropylene polymer, preferably polypropylene polymer which is grafted by diacid or diacid anhydride groups, preferably polypropylene polymer grafted by maleic acid anhydride (MAH) groups (MAH-polypropylene). Such functionalised polypropylene polymers are well known and e.g. commercially available.

The optional plastomer of the polypropylene composition (CB) and the optional amounts thereof are preferably 3 to 30, preferably 5 to 20, wt %. The further preferable properties of the plastomer for the polypropylene composition (CB) are as defined above in context of the polypropylene composition (CA).

The inorganic filler in polypropylene composition (CB) is preferably pigment, more preferably white pigment. White pigment is preferably $TiO_2$. Such pigments are well known and e.g. available as commercial $TiO_2$ and carbon black products. Any carrier medium, e.g. carrier polymer, is calculated to the amount of the pigment.

The heterophasic copolymer of propylene (A) of the polypropylene composition (CA) or of the polypropylene composition (CB) has preferably one or more, in any order, preferably all, of the following properties:
- $MFR_2$ of 0.2 to 15.0, preferably of 0.5 to 10, more preferably of 1.0 to 7.0, g/10 min when measured according to ISO 1133 (at 230° C. and 2.16 kg load),
- Xylene cold soluble (XCS) fraction in amount of 3 to 30, preferably of 5 to 25, preferably 5 to 20, preferably 8 to 17, wt %, when measured as described below under Determination methods,
- Comonomer content of 0.5 to 20, preferably of 1.0 to 20, preferably of 1.2 to 10, more preferably of 2.0 to 10, more preferably of 2.0 to 8, wt %, when measured as described below under Determination methods, preferably the comonomer(s) is selected from ethylene and/or C4-C8 alpha olefin comonomers, more preferably from ethylene,
- Melting temperature, Tm, of 158 to 170, preferably of 160 to 170, preferably of 163 to 170, more preferably of 163 to 167, ° C., when measured as described below under Determination methods,
- Flexural modulus of at least 900, preferably of 950 to 3000, preferably of 1000 to 2400, preferably of 1100 to 2300, more preferably of 1200 to 2200, MPa, when measured according to ISO 178 as described below under Determination methods,
- Density of 900 to 910 kg/m³, when measured as described below under Determination methods, and/or
- Vicat softening temperature (Vicat A) of at least 100, preferably of 130 to 200, preferably 145 to 165, more preferably of 148 to 165, ° C.

Preferably, the polypropylene matrix component (a1) of the heterophasic copolymer of propylene (A) of the polypropylene composition (CA) or of the polypropylene composition (CB) is a homopolymer of propylene.

The heterophasic copolymer of propylene (B) of the polypropylene composition (CA) or of the polypropylene composition (CB) has preferably one or more, in any order, preferably all, of the following properties:
- $MFR_2$ of 3.0 to 25.0, preferably of 5.0 to 20, more preferably of 7 to 18, g/10 min, when measured according to ISO 1133 (at 230° C. and 2.16 kg load),
- Xylene cold soluble (XCS) fraction in amount of 10 to 60, preferably of 15 to 50, preferably of 15 to 40, preferably of 20 to 37, wt %, when measured as described below under Determination methods,
- Comonomer content of 5.0 to 35, preferably of 5.0 to 30, preferably of 7.0 to 25, more preferably of 10 to 20, wt %, when measured as described below under Determination methods, preferably the comonomer(s) is selected from ethylene and/or C4-C8 alpha olefin comonomers, more preferably from ethylene,
- Melting temperature, Tm, of 158 to 170, preferably of 160 to 170, more preferably of 163 to 167, ° C., when measured as described below under Determination methods,
- Flexural modulus of less than 1000, preferably of 300 to 950, preferably of 400 to 900, preferably of 500 to 900, more preferably of 550 to 850, MPa, when measured according to ISO 178 as described below under Determination methods, Density of 900 to 910 kg/m$^3$, when measured as described below under Determination methods, and/or Vicat softening temperature (Vicat A) of at least 90, preferably of 100 to 200, preferably 105 to 150, more preferably of 110 to 145, ° C.

Preferably, the polypropylene matrix component (b1) of the heterophasic copolymer of propylene (B) of the polypropylene composition (CA) or of the polypropylene composition (CB) is a homopolymer of propylene.

Accordingly, the composition of the invention preferably comprises also additives other than fillers. Such further additives are preferably suitable additives for film or photovoltaic module applications, including without limiting to, antioxidants, UV light stabilisers, nucleating agents, clarifiers, brighteners, acid scavengers, as well as slip agents, etc. Such additives are generally commercially available and are described, for example, in "Plastic Additives Handbook", 5th edition, 2001 of Hans Zweifel.

Each additive and/or inorganic filler can be used e.g. in conventional amounts. Any optional carrier polymers of additive and/or inorganic filler product(s), e.g. master batches of additives together with the carrier polymer, are calculated to the amount of the respective additive or inorganic filler based on the amount (100%) of the composition of the invention.

The following general description of the heterophasic copolymer of propylene, referred herein below as "PP copolymer", and the polymerisation thereof apply independently for heterophasic copolymer of propylene (A) and heterophasic copolymer of propylene (B) of the polypropylene composition (CA) and, respectively, of the polypropylene composition (CB).

The polypropylene matrix component of the PP copolymer may be a unimodal or a multimodal random copolymer or homopolymer of propylene which both have a well-known meaning. Multimodal random copolymer or homopolymer of propylene means herein that it has at least two polymer fractions which are different e.g. with one or two of the following properties: 1) weight average molecular weight or 2) MFR. In case of random copolymer of propylene as the matrix component, the copolymer can also be multimodal with respect to 3) comonomer content, optionally in combination with any or both of the above differences 1) and 2).

The matrix component of the PP copolymer can be a homopolymer or random copolymer of propylene. It is preferred that the matrix component of the PP copolymer is a homopolymer of propylene.

Accordingly, it is preferred that all the comonomers as defined above, which are present in the PP copolymer, originate from the elastomeric propylene copolymer component.

It is preferred that the PP copolymer consists of the matrix component and the elastomeric component. The PP copolymer may optionally comprise a prepolymer fraction, as well known in the polymer field. In such case the amount of the prepolymer is calculated to the amount of the matrix component.

The PP copolymer can be commercially available grade or can be produced e.g. by conventional polymerisation processes.

As to polymerisation of the heterophasic copolymer of propylene, the individual components (matrix and elastomeric components) of PP copolymer can be produced separately and blended mechanically by mixing in a mixer or extruder. However it is preferred that the PP copolymer comprising the matrix component and the elastomeric component are produced in a sequential process, using reactors in serial configuration and operating at different reaction conditions. As a consequence, each fraction prepared in a specific reactor will have its own molecular weight distribution, MFR and/or comonomer content distribution.

The PP copolymer according to this invention is preferably produced in a sequential polymerisation process, i.e. in a multistage process, known in the art, wherein the matrix component is produced at least in one slurry reactor, preferably at least in a slurry reactor, and optionally, and preferably in a subsequent gas phase reactor, and subsequently the elastomeric component is produced at least in one, i.e. one or two, gas phase reactor(s) (gpr), preferably in one gpr.

Accordingly it is preferred that the PP copolymer is produced in a sequential polymerisation process comprising the steps of (a) polymerising propylene and optionally at least one ethylene and/or C4 to C12 α-olefin, preferably propylene as the only monomer, in the presence of a catalyst in a first reactor (R1), (b) transferring the reaction mixture of the polymerised first polypropylene, preferably propylene homopolymer, fraction together with the catalyst, into a second reactor (R2), (c) polymerising in the second reactor (R2) and in the presence of said first polypropylene polymer, propylene and optionally at least one ethylene and/or C4 to C12 α-olefin, preferably propylene as the only monomer, in obtaining thereby the second polypropylene fraction, preferably said second polypropylene fraction is a second propylene homopolymer, whereby said first polypropylene fraction and said second polypropylene fraction form the matrix component of the PP copolymer, (d) transferring the reaction mixture of the polymerised matrix component of step (c) into a third reactor (R3), (e) polymerising in the third reactor (R3) and in the presence of the matrix component obtained in step (c), propylene and at least one ethylene and/or C4 to C12 α-olefin obtaining thereby the elastomeric component of PP copolymer, wherein the elastomeric propylene copolymer component is dispersed in said matrix component.

Optionally the elastomeric component can be produced in two reactors, whereby after above step (e), (f) transferring the polypropylene (PP) in which the first elastomeric propylene copolymer fraction is dispersed in a fourth reactor (R4), and (g) polymerising in the fourth reactor (R4) and in the presence of the mixture obtained in step (e) propylene and at least one ethylene and/or C4 to C12 α-olefin obtaining thereby the second elastomeric propylene copolymer fraction, whereby the polypropylene (PP), the first elastomeric propylene copolymer fraction, and the second elastomeric propylene copolymer fraction form the PP copolymer.

Preferably between the second reactor (R2) and the third reactor (R3) the monomers are flashed out.

The term "sequential polymerisation process" indicates that the heterophasic copolymer of propylene (A) is produced in at least two, like three, reactors connected in series. Accordingly the present process comprises at least a first reactor (R1) and a second reactor (R2), more preferably a first reactor (R1), a second reactor (R2), a third reactor (R3) and optionally a fourth reactor (R4). The term "polymerisation reactor" shall indicate one of the main polymerisation steps. Thus in case the process consists of four polymerisation reactors, this definition does not exclude the option that the overall process comprises for instance a prepolymerisation step in a prepolymerisation reactor. The term "consist of" is only a closing formulation in view of the main polymerisation reactors.

Any prepolymer fraction is counted into the amount of the first polypropylene fraction. The first reactor (R1) is preferably a slurry reactor (SR) and can be any continuous or simple stirred batch tank reactor or loop reactor operating in bulk or slurry. Bulk means a polymerisation in a reaction medium that comprises of at least 60% (w/w) monomer. According to the present invention the slurry reactor (SR) is preferably a (bulk) loop reactor (LR).

The second reactor (R2), the third reactor (R3) and the optional fourth reactor (R4) are preferably gas phase reactors (GPR). Such gas phase reactors (GPR) can be any mechanically mixed or fluid bed reactors. Preferably the gas phase reactors (GPR) comprise a mechanically agitated fluid bed reactor with gas velocities of at least 0.2 m/sec. Thus it is appreciated that the gas phase reactor is a fluidized bed type reactor preferably with a mechanical stirrer.

Thus in a preferred embodiment the first reactor (R1) is a slurry reactor (SR), like a loop reactor (LR), whereas the second reactor (R2), the third reactor (R3) and the optional fourth reactor (R4) are gas phase reactors (GPR). Accordingly for the instant process at least three, namely a slurry reactor (SR), like a loop reactor (LR), a first gas phase reactor (GPR-1), a second gas phase reactor (GPR-2) and an optional a third gas phase reactor (GPR-3) connected in series are used. In case of a prepolymerisation step a pre-polymerisation reactor is placed prior to the slurry reactor (SR).

A preferred multistage process is a "loop-gas phase"-process, such as developed by Borealis A/S, Denmark (known as BORSTAR® technology) described e.g. in patent literature, such as in EP 0 887 379, WO 92/12182 WO 2004/000899, WO 2004/111095, WO 99/24478, WO 99/24479 or in WO 00/68315.

A further suitable slurry-gas phase process is the Spheripol® process of LyondellBasell.

Preferably, in the instant process for producing the PP copolymer as defined above the conditions for the first reactor (R1), i.e. the slurry reactor (SR), like a loop reactor (LR), of step
(a) may be as follows:
the temperature is within the range of 50° C. to 110° C., preferably between 60° C. and 100° C., more preferably between 68 and 95° C.,
the pressure is within the range of 20 bar to 80 bar, preferably between 40 bar to 70 bar,
hydrogen can be added for controlling the molar mass in a manner known per se.

Subsequently, the reaction mixture from step (a) is transferred to the second reactor (R2), i.e. gas phase reactor (GPR-1), i.e. to step (c), whereby the conditions in step (c) are preferably as follows:
the temperature is within the range of 50° C. to 130° C., preferably between 60° C. and 100° C.,
the pressure is within the range of 5 bar to 50 bar, preferably between 15 bar to 35 bar,
hydrogen can be added for controlling the molar mass in a manner known per se.

The condition in the second gas phase reactor (GPR-2) and in the optional third gas phase reactor (GPR-3) are similar to the second reactor (R2) (=first gas phase reactor (GPR-1).

The residence time can vary in the three reactor zones.

In one embodiment of the process for producing the matrix component of the PP copolymer, the residence time in bulk reactor, e.g. loop, is in the range 0.1 to 2.5 hours, e.g. 0.15 to 1.5 hours and the residence time in gas phase reactor will generally be 0.2 to 6.0 hours, like 0.5 to 4.0 hours.

If desired, the polymerisation may be effected in a known manner under supercritical conditions in the first reactor (R1), i.e. in the slurry reactor (SR), like in the loop reactor (LR), and/or as a condensed mode in the gas phase reactors (GPR).

Preferably the process comprises also a prepolymerisation with the catalyst system, as described in detail below, comprising a Ziegler-Natta procatalyst, an external donor and optionally a cocatalyst.

In a preferred embodiment, the prepolymerisation is conducted as bulk slurry polymerisation in liquid propylene, i.e. the liquid phase mainly comprises propylene, with minor amount of other reactants and optionally inert components dissolved therein.

The prepolymerisation reaction is typically conducted at a temperature of 10 to 60° C., preferably from 15 to 50° C., and more preferably from 20 to 45° C.

The pressure in the prepolymerisation reactor is not critical but must be sufficiently high to maintain the reaction mixture in liquid phase. Thus, the pressure may be from 20 to 100 bar, for example 30 to 70 bar.

The catalyst components are preferably all introduced to the prepolymerisation step. However, where the solid catalyst component (i) and the cocatalyst (ii) can be fed separately it is possible that only a part of the cocatalyst is introduced into the prepolymerisation stage and the remaining part into subsequent polymerisation stages. Also in such cases it is necessary to introduce so much cocatalyst into the prepolymerisation stage that a sufficient polymerisation reaction is obtained therein.

It is possible to add other components also to the prepolymerisation stage. Thus, hydrogen may be added into the prepolymerisation stage to control the molecular weight of the prepolymer as is known in the art. Further, antistatic additive may be used to prevent the particles from adhering to each other or to the walls of the reactor.

The precise control of the prepolymerisation conditions and reaction parameters is within the skills of the skilled person.

After the PP copolymer has been removed from the last polymerisation stage, it is preferably subjected to process steps for removing the residual hydrocarbons from the polymer. Such processes are well known in the art and can include pressure reduction steps, purging steps, stripping steps, extraction steps and so on. Also combinations of different steps are possible.

After the removal of residual hydrocarbons the PP copolymer is preferably mixed with additives as it is well known in the art. Such additives are described below under the polymer composition of the invention. The polymer particles are then extruded to pellets as it is known in the art.

Preferably co-rotating twin screw extruder is used for the extrusion step. Such extruders are manufactured, for instance, by Coperion (Werner & Pfleiderer) and Japan Steel Works.

The PP copolymer of the invention is preferably produced by polymerisation using any suitable Ziegler-Natta type.

Typical suitable Ziegler-Natta type catalyst is stereospecific, solid high yield Ziegler-Natta catalyst component comprising as essential components Mg, Ti and Cl. In addition to the solid catalyst a cocatalyst(s) as well external donor(s) are typically used in polymerisation process.

Components of catalyst may be supported on a particulate support, such as inorganic oxide, like silica or alumina, or, usually, the magnesium halide may form the solid support. It is also possible that catalysts components are not supported on an external support, but catalyst is prepared by emulsion-solidification method or by precipitation method.

Alternatively the PP copolymer of the invention can be produced using a modified catalyst system as described below.

More preferably, a vinyl compound of the formula (I) is used for the modification of the catalyst:

$$CH2=CH-CHR1R2 \quad (I)$$

wherein R1 and R2 together form a 5- or 6-membered saturated, unsaturated or aromatic ring, optionally containing substituents, or independently represent an alkyl group comprising 1 to 4 carbon atoms, whereby in case R1 and R2 form an aromatic ring, the hydrogen atom of the —CHR1R2 moiety is not present.

More preferably, the vinyl compound (I) is selected from: vinyl cycloalkane, preferably vinyl cyclohexane (VCH), vinyl cyclopentane, 3-methyl-1-butene polymer and vinyl-2-methyl cyclohexane polymer. Most preferably the vinyl compound (I) is vinyl cyclohexane (VCH) polymer.

The solid catalyst usually also comprises an electron donor (internal electron donor) and optionally aluminium. Suitable internal electron donors are, among others, esters of carboxylic acids or dicarboxylic acids, like phthalates, maleates, benzoates, citraconates, and succinates, 1,3-diethers or oxygen or nitrogen containing silicon compounds. In addition mixtures of donors can be used.

The cocatalyst typically comprises an aluminium alkyl compound. The aluminium alkyl compound is preferably trialkyl aluminium such as trimethylaluminium, triethylaluminium, tri-isobutylaluminium or tri-n-octylaluminium. However, it may also be an alkylaluminium halide, such as diethylaluminium chloride, dimethylaluminium chloride and ethylaluminium sesquichloride.

Suitable external electron donors used in polymerisation are well known in the art and include ethers, ketones, amines, alcohols, phenols, phosphines and silanes. Silane type external donors are typically organosilane compounds containing Si—OCOR, Si—OR, or Si—NR$_2$ bonds, having silicon as the central atom, and R is an alkyl, alkenyl, aryl, arylalkyl or cycloalkyl with 1-20 carbon atoms are known in the art.

Examples of suitable catalysts and compounds in catalysts are shown in among others, in WO 87/07620, WO 92/21705, WO 93/11165, WO 93/11166, WO 93/19100, WO 97/36939, WO 98/12234, WO 99/33842, WO 03/000756, WO 03/000757, WO 03/000754, WO 03/000755, WO 2004/029112, EP 2610271, WO 2012/007430. WO 92/19659, WO 92/19653, WO 92/19658, U.S. Pat. Nos. 4,382,019, 4,435, 550, 4,465,782, 4,473,660, 4,560,671, 5,539,067, 5,618,771, EP45975, EP45976, EP45977, WO 95/32994, U.S. Pat. Nos. 4,107,414, 4,186,107, 4,226,963, 4,347,160, 4,472,524, 4,522,930, 4,530,912, 4,532,313, 4,657,882, 4,581,342, 4,657,882.

In case of the preferable embodiments of the polypropylene composition (CA) and the polypropylene composition (CB), the heterophasic copolymer of propylene (A) and heterophasic copolymer of propylene (B) are produced separately and compounded together with the optional plastomer and/or optional adhesive polymer components, inorganic filler and further additives. The compounding is effected in an extruder as described above and the obtained melt mix is preferably pelletised before used for the end application. Part or all of the additives other than the inorganic filler may be incorporated to one or both of PP copolymer (A) and/or PP copolymer (B) or added during the compounding step.

End Applications of the Polymer Composition

The invention is further directed to a use of the polymer composition as defined above or below for producing at least one layer of a layer element, preferably of a multilayer element, more preferably of a layer element of an article, preferably of a photovoltaic module, more preferably of a multilayer element of a photovoltaic module.

Accordingly, preferably, the invention is directed to a use of the polypropylene composition (CA) or polypropylene composition (CB) as defined above or in claims for producing the at least one layer of a layer element, preferably of a multilayer element, more preferably of a layer element of an article, preferably of a photovoltaic module, more preferably of a multilayer element of a photovoltaic module. More preferably, the invention is directed to a use of the polypropylene composition (CA) or polypropylene composition (CB) as defined above or in claims for producing said at least one layer of a layer element, comprising, preferably consisting of the polypropylene composition (CA) or polypropylene composition (CB) as defined above or in claims.

Further preferably, the invention is directed to a layer element, preferably to a multilayer element, more preferably to a layer element of an article, preferably of a photovoltaic module, more preferably to a multilayer element of a photovoltaic module, wherein said layer element comprises at least one layer comprising the polymer composition as defined above or in claims. Preferably the at least one layer of a layer element, preferably of a multilayer element, more preferably of a layer element of an article, preferably of a photovoltaic module, more preferably of a multilayer element of a photovoltaic module, comprises, preferably consists of a polypropylene composition (CA) or polypropylene composition (CB) as defined above or in claims.

In one preferable embodiment, the at least one layer of the layer element, preferably of the multilayer element, more preferably of the layer element of an article, preferably of a photovoltaic module, more preferably of the multilayer element of a photovoltaic module, comprises, preferably consists of, a polypropylene composition (CA), which comprises 5 to 50 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises a polypropylene matrix component (a1) and an elastomeric propylene copolymer component (a2) which is dispersed in said polypropylene matrix (a1), and 20 to 60 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
a polypropylene matrix component (b1) and
an elastomeric propylene copolymer component (b2) which is dispersed in said polypropylene matrix (b1),
10 to 40 wt % of an inorganic filler,
0 to 30 wt % of an plastomer, and
0.3 to 5 wt % of an additive(s) other than the inorganic filler,
based on the total amount (100 wt %) of the polypropylene composition;
wherein the XCS of heterophasic copolymer of propylene (B) is higher than the XCS of heterophasic copolymer of propylene (A); as defined above or in claims.

In another equally preferable embodiment, the at least one layer of the layer element, preferably of the multilayer element, more preferably of the layer element of an article, preferably of a photovoltaic module, more preferably of the multilayer element of a photovoltaic module, comprises, preferably consists of,
a polypropylene composition (CB), which comprises
0 to 60 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
a polypropylene matrix component (a1) and
an elastomeric propylene copolymer component (a2) which is dispersed in said polypropylene matrix (a1), and
15 to 85 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises
a polypropylene matrix component (b1) and
an elastomeric propylene copolymer component (b2) which is dispersed in said polypropylene matrix (b1),
15 to 45 wt % of an inorganic filler,
0 to 30 wt % of an adhesive polymer,
0 to 30 wt % of a plastomer, and
0.3 to 5.0 wt % of an additive(s) other than the inorganic filler;
based on the total amount (100 wt %) of the polypropylene composition;
wherein, if the heterophasic copolymer of propylene (A) is present, then the XCS of heterophasic copolymer of propylene (B) is higher than the XCS of heterophasic copolymer of propylene (A); as defined above or in claims.

In the above one preferable embodiment, the layer element, preferably a multilayer element, more preferably a multilayer element of an article, preferably of a photovoltaic module, comprises at least one layer which comprises, preferably consists of, the polypropylene composition (CA) as defined above or in claims; and optionally, and preferably, at least another layer which comprises, preferably consists of, the polypropylene composition (CB) as defined above or in claims.

In the above equally preferable embodiment, the layer element, preferably a multilayer element, more preferably a multilayer element of an article, preferably of a photovoltaic module, comprises at least one layer which comprises, preferably consists of, the polypropylene composition (CB) as defined above or in claims; and optionally, and preferably, at least another layer which comprises, preferably consists of, the polypropylene composition (CA) as defined above or in claims.

In a preferable embodiment of the invention the layer element is a multilayer element, preferably a multilayer element of an article, preferably of a photovoltaic module, comprising at least one layer comprising, preferably consisting of, the polypropylene composition (CA) or polypropylene composition (CB) as defined above or in claims. More preferably, the layer element is a multilayer element, preferably a multilayer element of an article, preferably of a photovoltaic module, comprising at least one layer comprising, preferably consisting of, the polypropylene composition (CA) as defined above or in claims and at least another layer comprising, preferably consisting of, the polypropylene composition (CB) as defined above or in claims.

Preferably said least one layer of the layer element comprising the polypropylene composition (CA) and said at least another layer of the layer element comprising the polypropylene composition (CB) are in direct contact to each other.

In a preferred embodiment of the invention, the layer element is a multilayer element, preferably a multilayer element of an article, preferably of a photovoltaic module, wherein the multilayer element comprises at least three layers. Preferably, the multilayer element comprises, in the given order, at least first layer/second layer/third layer, wherein at least the first layer, preferably the first layer and third layer, comprise(s), preferably consist(s) of, the polypropylene composition (CB) as defined above or in claims and the second layer comprises, preferably consists of, the polypropylene composition (CA) as defined above or in claims.

The multilayer element of the invention can be extruded, e.g. coextruded, or laminated. Extrusion and lamination process are well known in the art.

In a preferred embodiment the layer(s) of the layer element of the invention are manufactured by extrusion. Layer elements with more than one layer are preferably manufactured by coextrusion. Coextruded layers show low delamination in the use e.g. as part of a PV module.

In more preferable embodiment of said multilayer element comprising, in the given order, at least first layer/second layer/third layer as defined above or in claims, said three-layer element is produced by coextrusion.

Preferable in said three-layer element, the first layer is in direct contact to one side of the second layer and the third layer is in direct contact to the other side of the second layer.

In more preferable embodiment of said multilayer element comprises, in the given order, a coextruded first layer/second layer/third layer as defined above or in claims.

In one embodiment, the layer element of the present invention can also comprise additional layers which can be of polymeric or non-polymeric material. Non-limiting examples of non-polymeric layers can include metal-layers, e.g. comprising Aluminium, Copper or combinations thereof. Such optional additional layers are preferably incorporated to the layer element after formation of the layer(s) of the invention, preferably after formation of the layer(s) of the invention by extrusion, preferably by coextrusion. The optional additional layers can be incorporated to the layer element of the invention for instance by lamination.

Accordingly, in case the (multi)layer element of the invention is combined with other layer(s), then the multilayer element is e.g. laminated with the other layer(s). In particular non-polymeric materials or other polymeric materials with low adhesion properties on the polypropylene composition can be laminated, e.g. in a roll to roll process on a lamination line, to the (multi)layer element of the invention. Such layers to be laminated are preferably coated with an adhesive/adhesive layer (e.g. a polyurethane adhesive system).

Most preferably, said multilayer element of at least first layer/second layer/third layer as defined above, below or in claims consists of said first layer, said second layer and said third layer.

The total thickness of the layer element of the invention is, only as an example, i.e. without limiting to, typically up to 700, like 90 to 700, suitably 140 to 500, such as 240 to 400, m.

In case of the preferred multilayer element of at least first layer/second layer/third layer, the first and preferably also the third layer has/have preferably a thickness of 20 to 200, preferably of 20 to 100 and more preferably of 20 to 50, m. The second layer has preferably a thickness of 50 to 300, preferably of 100 to 300 and more preferably of 200 to 300, m.

The invention further provides an article which comprises a layer element, wherein said layer element comprises at least one layer comprising the polymer composition of the invention. The preferred article is a photovoltaic module as described above, below or in claims, comprising the layer element of the invention.

Photovoltaic Module

The layer element, preferably the multilayer element, preferably the multilayer element of the at least first layer/second layer/third layer, of the invention is preferably a layer element, preferably a multilayer layer element, preferably a coextruded three-layer multilayer element, of a photovoltaic module.

The invention thus also provides a photovoltaic module comprising at least one photovoltaic element and at least one layer element which is the layer element of the invention comprising at least one layer which comprises said polypropylene composition of the invention. Preferably the layer element of the PV module is a multilayer element.

In a preferable embodiment, the photovoltaic module comprises, in the given order, a protective front layer element, such as a glass layer element, front encapsulation layer element, a photovoltaic element, rear encapsulation layer element and a protective back layer element, which is herein also called as a backsheet layer element, wherein at least one or more, or all, of said front encapsulation layer element, rear encapsulation layer element or backsheet layer element comprises the layer element of the invention comprising at least one layer, which comprises the polymer composition of the invention.

Moreover, the materials of the layer(s) of the protective front layer element, such as a glass layer element, of the photovoltaic element, which is preferably an element of photovoltaic cells together with connectors, of the front/rear encapsulation layer element and of the backsheet element, which are other than the layer of the polymer composition of the invention, are typically e.g. well known materials in the photovoltaic module field and are commercially available or can be produced according to or in accordance to the methods known in the literature for the photovoltaic module filed.

Accordingly, it is preferred the photovoltaic module comprises a layer element of the invention, as defined above or in claims, wherein at least one layer comprises, preferably consists of, the polymer composition of the invention, including the preferable embodiments of the polypropylene composition (CA) or polypropylene composition (CB).

It is preferred that the photovoltaic module comprises a multilayer element of the invention comprising at least first layer/second layer/third layer-element, wherein at least the first layer, preferably the first layer and third layer, comprise(s), preferably consist(s) of, the polypropylene composition (CB) as defined above, below or in claims and the second layer comprises, preferably consists of, the polypropylene composition (CA) as defined above, below or in claims.

More preferably, the photovoltaic module comprises a backsheet element comprising at least one layer which comprises, preferably consists of, the polypropylene composition (CA) or the polypropylene composition (CB) as defined above or in claims.

Most preferably, the photovoltaic module of the invention as defined above, below or in claims, comprises, in the given order, a protective front layer element, a front encapsulation layer element, a photovoltaic element, a rear encapsulation layer element, a backsheet layer element, wherein the layer element of the invention is the backsheet layer element, preferably a backsheet multilayer element, which comprises, preferably consists of, a first layer/second layer/third layer-element, in the given order, wherein the first layer and optionally, and preferably, the third layer preferably comprise(s), the polypropylene composition (CB), which comprises 0 to 60 wt % of a heterophasic copolymer of propylene (A) which has a Melting temperature (Tm) of at least 145° C. (DSC) when measured as described below under the Determination methods, and a Vicat softening temperature of at least 90° C. (according to ASTM D 1525, method A, 50° C./h, 10N), and which comprises a polypropylene matrix component (a1) and an elastomeric propylene copolymer component (a2) which is dispersed in said polypropylene matrix (a1), and 15 to 85 wt % of a heterophasic copolymer of propylene (B) which has a Melting temperature (Tm) of at least 145° C. (DSC), when measured as described below under the Determination methods, and a Vicat softening temperature of at least 90° C. (according to ASTM D 1525, method A, 50° C./h, 10N), and which comprises a polypropylene matrix component (b1) and an elastomeric propylene copolymer component (b2) which is dispersed in said polypropylene matrix (b1), 15 to 45 wt % of an inorganic filler, 0 to 30 wt % of an adhesive polymer, 0 to 30 wt % of a plastomer, and 0.3 to 5.0 wt % of an additive(s) other than the inorganic filler;

based on the total amount (100 wt %) of the polypropylene composition;

wherein, if the heterophasic copolymer of propylene (A) is present, then the XCS of heterophasic copolymer of propylene (B) is higher than the XCS of heterophasic copolymer of propylene (A); as defined above, below or in claims; and the second layer comprises the polypropylene composition (CA), which comprises 5 to 50 wt % of a heterophasic copolymer of propylene (A) which has a Melting temperature (Tm) of at least 145° C. (DSC), when measured as described below under the Determination methods, and a Vicat softening temperature of at least 90° C. (according to ASTM D 1525, method A, 50° C./h, 10N), and which comprises a polypropylene matrix component (a1) and an elastomeric propylene copolymer component (a2) which is dispersed in said polypropylene matrix (a1), and 20 to 60 wt % of a heterophasic copolymer of propylene (B) which has a Melting temperature (Tm) of at least 145° C. (DSC), when measured as described below under the Determination methods, and a Vicat softening temperature of at least 90° C. (according to ASTM D 1525, method A, 50° C./h, 10N), and which comprises a polypropylene matrix component (b1) and an elastomeric propylene copolymer component (b2) which is dispersed in said polypropylene matrix (b1), 10 to 40 wt % of an inorganic filler, 0 to 30 wt % of an plastomer, and 0.3 to 5 wt % of an additive(s) other than the inorganic filler, based on the total amount (100 wt %) of the polypropylene composition;

wherein the XCS of heterophasic copolymer of propylene (B) is higher than the XCS of heterophasic copolymer of propylene (A); as defined above, below or in claims.

Accordingly, the invention further provides a backsheet layer element comprising at least one layer which comprises, preferably consists of, the polypropylene composition (CA) or the polypropylene composition (CB), as defined above, below or in claims.

The invention further provides a backsheet layer element for a photovoltaic module, wherein the backsheet layer element comprises the layer element of the invention comprising at least one layer which comprises, preferably consists of, the polymer composition of the invention.

Backsheet layer element for a photovoltaic module is thus the layer element the invention, preferably the multilayer element of the invention, comprising a first layer/second layer/third layer-element, in the given order.

In the preferred embodiment, the backsheet layer element is a multilayer element comprising, preferably consisting of, a first layer/second layer/third layer-element, in the given order, wherein the first layer and optionally, and preferably, the third layer, comprise, preferably consist(s) of, the polypropylene composition (CB), which comprises 0 to 60 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises a polypropylene matrix component (a1) and an elastomeric propylene copolymer component (a2) which is dispersed in said polypropylene matrix (a1), and 15 to 85 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises a polypropylene matrix component (b1) and an elastomeric propylene copolymer component (b2) which is dispersed in said polypropylene matrix (b1), 15 to 45 wt % of an inorganic filler, 0 to 30 wt % of an adhesive polymer, 0 to 30 wt % of a plastomer, and 0.3 to 5.0 wt % of an additive(s) other than the inorganic filler;

based on the total amount (100 wt %) of the polypropylene composition;

wherein, if the heterophasic copolymer of propylene (A) is present, then the XCS of heterophasic copolymer of propylene (B) is higher than the XCS of heterophasic copolymer of propylene (A); as defined above or in claims; and the second layer comprises, preferably consists of, the polypropylene composition (CA), which comprises 5 to 50 wt % of a heterophasic copolymer of propylene (A) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises a polypropylene matrix component (a1) and an elastomeric propylene copolymer component (a2) which is dispersed in said polypropylene matrix (a1), and 20 to 60 wt % of a heterophasic copolymer of propylene (B) which has a Melting temperature (Tm) of at least 145° C. (DSC), when measured as described below under the Determination methods, and a Vicat softening temperature (Vicat A) of at least 90° C. (according to ASTM D 1525, method A, 50° C./h, 10N), and which comprises a polypropylene matrix component (b1) and an elastomeric propylene copolymer component (b2) which is dispersed in said polypropylene matrix (b1), 10 to 40 wt % of an inorganic filler, 0 to 30 wt % of an plastomer, and 0.3 to 5 wt % of an additive(s) other than the inorganic filler, based on the total amount (100 wt %) of the polypropylene composition;

wherein the XCS of heterophasic copolymer of propylene (B) is higher than the XCS of heterophasic copolymer of propylene (A); as defined above or in claims.

The preferable backsheet multilayer element comprising the first layer/second layer/third layer-element, preferably a coextruded first layer/second layer/third layer-element, wherein the first layer and the third layer comprise, preferably consist of, the polypropylene composition (CB) and the second layer comprises, preferably consists of, the polypropylene composition (CA).

The three-layer element of the preferable backsheet layer element of the invention is preferably produced by coextrusion.

The layer element, preferably the multilayer element, preferably the backsheet multilayer element, preferably the coextruded backsheet three-layer element, of the invention as a layer element(s) of the PV module, has/have preferably a thickness and is/are preferably produced as described above under End applications of the polymer composition.

In a further embodiment, the photovoltaic module can comprise layer element(s) of the present invention which are further combined with additional polymeric or non-polymeric material layers or a frame element. Non-limiting examples of such optional additional non-polymeric layers or frame elements include metal-layers, e.g. comprising Aluminium, Copper or combinations thereof. Non-limiting examples of such optional additional polymeric layers include polyethylene terephthalate (PET) and polybutylene terephthalate (PBT). If desired, the adhesion between the layers can be improved or achieved by the use of an adhesive, e.g. a polyurethane adhesive. The sequence of the optional additional layers can vary depending on their intended use in a PV-module.

Accordingly, for instance the preferable coextruded backsheet three-layer element of the invention can form as such the backsheet multilayer element, can be part of the backsheet multilayer element comprising further, additional layers as mentioned above. Moreover, the preferable backsheet layer element can be integrated to another layer element (like rear encapsulation) or at least part of the layers of the preferable backsheet layer element can be integrated to another layer element. Such integrated layer elements of the PV module can be produced e.g. by lamination, extrusion or coextrusion before the assembling step of the PV module. Examples of the details regarding the manufacture of such a laminate can be found below under the experimental part including, as stated in the context, sample preparation description as described under Determination methods.

Preferably, the layer(s) of the backsheet layer element of the photovoltaic module of the invention is/are free from fluoride containing polymer.

The preferred backsheet multilayer element consists of the coextruded three-layer backsheet element.

As well known, the different elements and the layer structure of the photovoltaic module of the invention can vary depending on the desired type of the PV module. The photovoltaic module can be rigid or flexible. The rigid photovoltaic module can for example contain a glass layer element as the protective front layer element or the above mentioned rigid frame element, e.g. an aluminium frame element. In flexible modules all the above elements are flexible, whereby the protective front and back layer elements as well as the front and rear encapsulation layer elements are typically based on polymeric layer elements.

Moreover, the elements of the PV module other than the layer element of the invention can be monolayer elements or multilayer elements.

The photovoltaic module of the invention can be produced in a manner well known in the field of the photovoltaic modules. Any multilayer elements can partly or fully be extruded, like coextruded, or laminated in a known manner using the conventional extruder and film formation equipment, as well known for a skilled person.

The different elements, like protective front layer element, front encapsulation layer element, Photovoltaic layer element, rear encapsulation layer element and the backsheet layer element, of the photovoltaic module of the invention are typically assembled together by conventional means to produce the final photovoltaic module. The elements are typically produced separately or, as mentioned above, partly in integrated form before subjecting to such assembly step. The different elements are then typically arranged as the PV module assembly and then attached together by lamination using the conventional lamination techniques in the field. The lamination techniques and conditions are with the skills of a skilled person.

The assembly of photovoltaic module is well known in the field of photovoltaic modules.

The FIGURE is a schematic illustration of the above embodiment of the photovoltaic module of the invention. In said FIGURE the "back sheet"-layer element comprises the layer element of the invention, preferably the preferred three-layer element as defined above.

Determination Methods

Melt Flow Rate:

The melt flow rate (MFR) is determined according to ISO 1133 and is indicated in g/10 min. The MFR is an indication of the flowability, and hence the processability, of the polymer. The higher the melt flow rate, the lower the viscosity of the polymer. The $MFR_2$ of polypropylene is measured at a temperature 230° C. and a load of 2.16 kg. The $MFR_2$ of polyethylene is measured at a temperature 190° C. and a load of 2.16 kg Density:

ISO 1183, measured on compression moulded plaques

Comonomer Content:

The comonomer content was determined by quantitative Fourier transform infrared spectroscopy (FTIR) after basic assignment calibrated via quantitative $^{13}C$ nuclear magnetic resonance (NMR) spectroscopy in a manner well known in the art. Thin films are pressed to a thickness of between 100-500 micrometer and spectra recorded in transmission mode.

Specifically, the ethylene content of a polypropylene-co-ethylene copolymer is determined using the baseline corrected peak area of the quantitative bands found at 720-722 and 730-733 $cm^{-1}$. Specifically, the butene or hexene content of a polypropylene copolymer is determined using the baseline corrected peak area of the quantitative bands found at 1377-1379 $cm^{-1}$. Quantitative results are obtained based upon reference to the film thickness.

The comonomer content is herein assumed to follow the mixing rule (equation 2):

$$C_b = w_1 * C_1 + w_2 * C_2 \quad \text{(eq. 2)}$$

Where C is the content of comonomer in weight-%, w is the weight fraction of the component in the mixture and subscripts b, 1 and 2 refer to the overall mixture, component 1 and component 2, respectively.

As it is well known to the person skilled in the art the comonomer content in weight basis in a binary copolymer can be converted to the comonomer content in mole basis by using the following equation $$c_m = \frac{1}{1 + \left(\frac{1}{c_w} - 1\right) * \frac{MW_c}{MW_m}} \quad \text{(eq. 3)}$$

where $c_m$ is the mole fraction of comonomer units in the copolymer, $c_w$ is the weight fraction of comonomer units in the copolymer, $MW_c$ is the molecular weight of the comonomer (such as ethylene) and $MW_m$ is the molecular weight of the main monomer (i.e., propylene).

Melting Temperature ($T_m$) and Heat of Fusion ($H_f$):

measured with Mettler TA820 differential scanning calorimetry (DSC) on 5 to 10 mg samples. DSC is run according to ISO 3146/part 3/method C2 in a heat/cool/heat cycle with a scan rate of 10° C./min (heating and cooling) in the temperature range of +23 to +210° C. The melting temperature and heat of fusion ($H_f$) are determined from the second heating step. The melting temperatures were taken as the peaks of endotherms.

Flexural Modulus:

The flexural modulus was determined according to ISO 178. The test specimens having a dimension of 80×10×4.0 $mm^3$ (length×width×thickness) were prepared by injection molding according to EN ISO 1873-2. The length of the span between the supports was 64 mm, the test speed was 2 mm/min and the force was 100 N.

Xylene Cold Soluble (XCS):

The amount of xylene cold soluble fraction was determined according to ISO 16152. The amount of polymer which remains dissolved at 25° C. after cooling is given as the amount of xylene soluble polymer.

The content of xylene soluble polymer is herein assumed to follow the mixing rule (equation 4):

$$XS_b = w_1 \cdot XS_1 + w_2 \cdot XS_2 \qquad (eq. 4)$$

Where XCS is the content of xylene soluble polymer in weight-%, w is the weight fraction of the component in the mixture and subscripts b, 1 and 2 refer to the overall mixture, component 1 and component 2, respectively.

Charpy Impact Strength Notched:

NIS was determined according to ISO 179-1eA:2000 on V-notched samples of 80×10×4 mm$^3$ at 23° C., 0° C., −10° C. or −20° C., as specified in the experimental part. The test specimens were prepared by injection moulding using an IM V 60 TECH machinery in line with EN ISO 1873-2 (80*10×4 mm$^3$).

The melt temperature was 200° C. and the mould temperature was 40° C.

Heat Deflection Temperature (HDT):

was measured according to ISO 75-2. The test specimens having a dimension of 80×10×4.0 mm$^3$ (length×width×thickness) were prepared by injection molding according to EN ISO 1873-2. The test specimen is loaded in three-point bending in the flatwise direction (support span: 64 mm). The outer fiber stress used for testing is 1.80 MPa (Method A). The Temperature is raised with constant heating rate of 120 K/h. The HDT is the temperature at which the bending of the test-specimen reaches a flexural strain increase of 0.2%.

Vicat Softening Temperature:

measured according to ASTM D 1525 method A (50° C./h, 10N).

Tensile Modulus; Tensile Stress at Yield and Tensile Strain at Break:

Injection Moulded Specimens:

are prepared as described in EN ISO 1873-2 (dog bone shape, 4 mm thickness) and measured according to ISO 527-2 (cross head speed=1 mm/min; 23° C.) for injection molded sample specimen Monolayer Film Samples:

are prepared as prepared below under "Film preparation" specified below and measured according to ISO 527-3 using the below given conditions.

Monolayer Film Preparation:

200 mm cast films were prepared on a Plastic Maschinenbau extruder with 3 heating zones equipped with a PP screw with a diameter of 30 mm, a 200 mm die with a die gap of 0.5 mm. The melt temperature of 250° C. and a chill roll temperature of 60° C. were used Film Samples (200 µm Monolayer):

Before the first test, the film sample must be stored at 23° C./50% RH over a period of 96 hours. The test specimen shall be cut with a film cutter so that the edges are smooth, free from notches and have an exact width. The form of test specimen is a strip 15 mm wide and not less than 150 mm long. The specimens were cut in machine direction.

Test Conditions Film Tensile Test:

The test is performed according to ISO 527-3 using the following test condition set:

Test conditions: 23° C./50% RH
Preload: app. 0.2N
Speed of preload: 2 mm/min
Speed of E-Modulus: 1 mm/min
Speed of testing: 200 mm/min
Clamping distance: 100 mm Start of E-Modulus testing: 0.05%
End of E-Modulus testing: 0.25%

Tensile, Adhesion and Thermal Cycling Test (TCT) Using Three-Layer Film Sample Preparations:

Three-Layer Test Sample Preparations:

Three-layer film samples of the PP-components of this invention are produced by means of co-extrusion on an extrusion line fabricated by the company Dr. Collin using barrier screws for the extruders. The extruders were set to a temperature of 250° C. in each section, while the feeder was set to a temperature of 30° C. The melt temperature was at about 260° C. The dye was set to 210° C. The extrusion was done with a speed of 3 m/min.

The obtained 3-layer samples were used for

1) Tensile test (ISO 527, see the conditions above for monolayer) using the 3-layer film as prepared above, wherein each of the three layers consists of the composition of the invention as described below in the Experimental part, 2) The below described interlayer adhesion tests of the three layer element, wherein each of the three layers consists of the composition of the invention as described below in the Experimental part, 3) The below described TCT test of layer element wherein each of the three layers consists of the composition of the invention as described below in the Experimental part, and 4) The System voltage test as described above in the specification using the three layer film, wherein each of the three layers consists of the composition of the invention as described below in the Experimental part, Lamination for Adhesion Tests:

Laminated multi-layer films are produced in a roll to roll process on a lamination line, where one layer is coated with a polyurethane adhesive system (solvent borne system). The solvent is then evaporated at a temperature of 120° C. in a ventilated dryer. The adhesive system is applied between 1 g/m$^2$ and 15 g/m$^2$ (values without solvent) in accordance with the layers that are combined. The combination of the layers takes place after the ventilated dryer by pressing the two layers together by the use of two pressing rolls. After this the multi-layer material is rolled up using a winder. By repeating this sequence from the beginning a third or more layers can be added to the multi-layer film.

The interlayer adhesion of three-layer film samples of the PP-components of this invention were prepared as described above under Three-layer Test sample preparations and tested as follows: Samples for testing of the interlayer adhesion in three-layer specimen are prepared by gluing the specimen onto an aluminium plate (thickness of 0.5 mm) with an epoxy adhesive. The epoxy is then left to cure. When peeling off the specimen from the aluminium plate the layers are not allowed to separate. The specimen may elongate or break.

Thermal Cycling Test (TCT)

Lamination for TCT Test:

For testing a lab scale module with a dimension of 15×17 cm the following setup is used. Front glass, thickness 3.2 mm/2 layers of EVA (Ethylene vinyl acetate copolymer)/layer element as it is the object of the invention. This setup is then laminated using a vacuum lamination process according to the recommendation of the EVA manufacturer.

The material was left to cool down for 24 h and then put into the Thermal cycling test. Test results are judged by an optical inspection.

TCT is tested according to IEC 61215/IEC 61646 between temperatures of −40° C. to 85° C. 4 cycles a day are done following the guidelines given in the standard.

Adhesion Between Encapsulant (EVA) and Backsheet:

Two separate pieces of the layer element as it is the object of this invention are laminated together with one layer of encapsulant (EVA) according to the lamination parameters of the respective encapsulant type. In a small section a release paper is put in to be able to separate the laminate in this area. Stripes with a width of 20 mm are cut and put into a Zwick tensile testing device and a T-peel test is carried out at a testing speed of 50 mm/min. The calculated peel strength is the average of five samples.

EXPERIMENTAL PART

Polymerisation process of the components heterophasic copolymer of propylene (A) (referred below as HECO A) and heterophasic copolymer of propylene (B) (referred below as HECO B) of the inventive polymer compositions IE1-IE7.

Catalyst Preparation:

Catalyst Preparation for HECO a Component and for HECO B Component:

First, 0.1 mol of $MgCl_2 \times 3$ EtOH was suspended under inert conditions in 250 ml of decane in a reactor at atmospheric pressure. The solution was cooled to the temperature of −15° C. and 300 ml of cold $TiCl_4$ was added while maintaining the temperature at said level. Then, the temperature of the slurry was increased slowly to 20° C. At this temperature, 0.02 mol of diethylhexylphthalate (DOP) was added to the slurry. After the addition of the phthalate, the temperature was raised to 135° C. during 90 minutes and the slurry was allowed to stand for 60 minutes. Then, another 300 ml of $TiCl_4$ was added and the temperature was kept at 135° C. for 120 minutes. After this, the catalyst was filtered from the liquid and washed six times with 300 ml heptane at 80° C. Then, the solid catalyst component was filtered and dried. Catalyst and its preparation concept is described in general e.g. in patent publications EP 491 566, EP 591 224 and EP 586 390.

Then triethylaluminium (TEAL), dicyclopentyldimethoxysilane (DCPDMS) as donor (Do), catalyst as produced above and vinylcyclohexane (VCH) were added into oil, like mineral oil, e.g. Technol 68 (kinematic viscosity at 40° C. 62-74 cSt), in amounts so that Al/Ti was 3-4 mol/mol, Al/Do was as well 3-4 mol/mol, and weight ratio of VCH/solid catalyst was 1:1. The mixture was heated to 60-65° C. and allowed to react until the content of the unreacted vinylcyclohexane in the reaction mixture was less than 1000 ppm. Catalyst concentration in the final oil-catalyst slurry was 10-20 wt %.

Polymerisation Examples

All Pilot scale polymers were produced with a prepolymerisation reactor, one slurry loop reactor and two gas phase reactors.

Catalyst Feeding

Catalyst was fed continuously to the polymerisation in oil slurry by the piston pump.

Co-Catalyst and Donor

Triethylaluminium (TEAL) was used as a co-catalyst and dicyclopentyldimethoxysilane (Donor D) was used as an external donor. Actual TEAL and donor feeds are given in table 1.

Prepolymerisation Reactor

The catalyst was flushed with propylene to the prepolymerisation reactor in which also TEAL and D-donor were fed. Prepolymerisation reactor, CSTR, was operated at 30° C. and 55 barg pressure. The residence time of the particles in propylene slurry was about 0.38 h.

Loop Reactor

The prepolymerised catalyst component was used in loop reactor and gas phase reactors (GPR) connected in series. The process conditions for the loop reactor are given in table 1.

Gas Phase Reactor 1

Polymer slurry was fed from loop to the gas phase reactor (GPR1) as a direct feed without flash. GPR operating temperatures and pressures are given in table 1.

Gas Phase Reactor 2

The product was transferred from GPR1 to GPR2 as an indirect feed via a flash tank. GPR operating temperatures and pressures are given in table 1.

Product Control

The production split between loop and GPR was controlled to be close to 50/50%. The MFR (2.16 kg/230° C.) was controlled by hydrogen feed.

Final HECO a and HECO B Components

The polymer powder obtained from GPR2 was further melt homogenised and pelletized using a Coperion ZSK57 co-rotating twin screw extruder with screw diameter 57 mm and L/D 22. Screw speed was 200 rpm and barrel temperature 200-220° C.

For HECO A, the following additives were added during the melt homogenisation step: 1500 ppm ADK-STAB A-612 (supplied by Adeka Corporation) and 300 ppm Synthetic hydrotalcite (ADK STAB HT supplied by Adeka Corporation).

For HECO B, the following additives were added during the melt homogenisation step: 1000 ppm ADK 25 STAB AO-60 (supplied by Adeka Corporation), 1000 ppm ADK-STAB 2112 RG (supplied by Adeka Corporation) and calcium stearate 500 ppm (CEASIT-AV/T, supplied by Baerlocher).

TABLE 1

Polymerisation conditions

| | HECO A | HECO B |
|---|---|---|
| TEAL/Ti [mol/mol] | 78 | 390 |
| TEAL/Donor [mol/mol] | 12 | 6 |
| TEAL/C3 [g/t] | 180 | 130 |
| Donor/C3 [g/t] | 30 | 44 |
| Prepolymerisation | | |
| B1 Temperature [° C.] | 30 | 28 |
| Loop | | |
| B2 Temperature [° C.] | 85 | 61 |
| B2 Pressure (barg) | 55 | 44 |
| B2 H2/C3 ratio [mol/kmol] | 1.4 | 8.6 |
| B2 Split [%] | 43.7 | 38.5 |
| GPR1 | | |
| B3 Temperature [° C.] | 85 | 79 |
| B3 Pressure (barg) | 23 | 15 |
| B3 H2/C3 ratio (mol/kmol) | 17 | 124 |
| B3 split [%] | 43.7 | 38.5 |
| GPR2 | | |
| B4 Temperature (° C.) | 71 | 60 |
| B4 Pressure (barg) | 17 | 15 |
| B4 C2/C3 ratio [mol/kmol] | 480 | 550 |
| B4 H2/C2 ratio [mol/kmol] | 460 | 500 |
| B4 split [%] | 12.6 | 23 |

TABLE 1-continued

Polymerisation conditions

| | HECO A | HECO B |
|---|---|---|
| Final product | | |
| MFR$_2$ [g/10 min] | 3 | 15 |
| Ethene comonomer content [wt. %] | 3.6 | 16 |
| XCS [wt. %] | 14 | 34 |
| Melting temp., Tm [° C.] | 165 | 164 |
| Vicat A [° C.] | 154 | 125 |
| Density [kg/m$^3$] | 905 | 905 |
| Flexural modulus | 1400 | 800 |

Further Components of the Inventive PP Polymer Compositions of IE1-IE7

Plastomer 1: Queo 8230, supplier Borealis, is an ethylene based octene plastomer, produced in a solution polymerisation process using a metallocene catalyst, MFR$_2$ (190° C.) of 30 g/10 min and density of 882 kg/m$^3$.

Plastomer 2: Engage 8150, supplier ExxonMobil, is an ethylene based octene plastomer, produced in a solution polymerisation process using a metallocene catalyst, MFR$_2$ (190° C.) of 0.5 g/10 min and density of 868 kg/m$^3$.

Adhesive: Maleic anhydride (MA) modified polypropylene of ExxonMobil, MFR$_2$ (230° C.) of 430 g/10 min, density of 900 kg/m$^3$, MA content of 0.5 to 1.0 wt %, supplier ExxonMobil. Talc and TiO2 are conventional commercial products.

Preparation of the Inventive PP Polymer Compositions of IE1-IE7:

The compositions of IE1-IE7 were prepared by compounding the polymers IE1-IE7 with the other components and conventional additives on a co-rotating twin-screw extruder (ZSK32, Coperion) using a screw speed of 400 rpm and a throughput of 90-100 kg/h. The melt temperature ranged from 210-230° C. The components and the amounts thereof are given below under table 2.

The reference comparative composition CE is identified in table 2 below.

TABLE 2

Inventive PP polymer compositions IE1-IE7 and reference PP composition CE

| | | | IE 1 (CA) | IE 2 (CA) | IE 3 (CA) | IE 4 (CB) | IE5 (CB) | CE | IE6 (CA) | IE7 (CB) |
|---|---|---|---|---|---|---|---|---|---|---|
| HECO B | | wt % | 45.2 | 39.2 | 41.6 | 53.25 | 31.25 | | 40.7 | 35.6 |
| HECO A | | wt % | 30.2 | 26.2 | 27.8 | | 22 | | 27.2 | |
| homoPP Ref. | | wt % | | | | | | 79.9 | | |
| Talc | | wt % | 23 | 27 | 23 | | | 20 | 23 | |
| Plastomer 1 | | wt % | 0 | 6 | 6 | | | | 8 | |
| Plastomer 2 | | wt % | | | | | | | | 18 |
| TiO2 | | wt % | | | | 35 | 35 | | | 35 |
| Adhesive | MAH-PP | wt % | | | | 10 | 10 | | | 10 |
| Additives | | wt % | 1.6 | 1.6 | 1.6 | 1.75 | 1.75 | 0.1 | 1.1 | 1.45 |
| | MFR | g/10 min | 7.6 | 6.8 | 6.6 | 11.8 | 6.2 | | 5.5 | 8.3 |
| | XCS | wt % | 17 | 21 | 23 | 14 | | | 23 | 25 |
| Injection moulded specimens | TM | MPa | 2463 | 2271 | 2016 | 1564 | 1794 | 4183 | 1915 | 1145 |
| | SaB | % | 119 | 165 | 395 | 92 | 69 | 10 | 398 | 360 |
| | Vicat A | ° C. | 148 | 141 | 138 | 147 | 152 | 161 | 136 | 126 |
| | HDT | ° C. | 61 | 58 | 54 | 48 | 52 | 85 | 55 | 47 |
| | CLTE MD | (1/K)*E−6 | 49 | 43 | 51 | 84 | 82 | — | 55 | 78 |
| | CLTE TD | (1/K)*E−6 | 92 | 98 | 116 | 117 | 104 | — | 107 | 135 |
| | IS (23) | kJ/m$^2$ | 11 | 22 | — | — | 9.5 | — | 17 | 73 |
| | IS(−20) | kJ/m$^2$ | 2.2 | 2.7 | | | 2.5 | | 2.6 | 9.9 |
| 200 μm monolayer cast film, MD ex Borealis | TM MD | MPa | 1688 | 1585 | 1699 | 1245 | 1312 | | 1408 | 896 |
| | TS | MPa | 30 | 26 | 28 | 26 | 34 | | 26 | 27 |
| | TSaB | % | 774 | 725 | 974 | 707 | 683 | | 956 | 841 |

TM tensile modulus

SaB strain at break

HDT HDT A (flatwise)

CLTE MD CLTE MD −30/80° C.

CLTE TD CLTE TD −30/80° C.

IS (23) impact strength, 23° C.

IS(−20) impact strength, −20° C.

TM MD tensile modulus, MD

TS tensile strength

TSaB tensile strain at break

TABLE 3

Properties of a three-layer film samples:

Properties

The 300 μm 3-layer film samples were prepared as described above under "Determination methods". The layers were prepared from IE3 (core layer) and IE4 (outer layers) as IE4/IE3/IE4 with layer thickness of (30 μm/240 μm/30 μm).

300 μm 3-layer IE4/IE3/IE4

| | | |
|---|---|---|
| TENSILE MODULUS, MD | MPa | 1560 |
| TENSILE STRENGTH MD | MPa | 20.7 |
| TENSILE STRAIN AT BREAK MD | % | 500.5 |
| Interlayer adhesion | N/cm | Breakage >50 |

A further 300 μm 3-layer film sample was prepared from IE6 (core layer) and IE7 (outer layers) as IE7/IE6/IE7 with layer thickness of (30 μm/240 μm/30 μm).

300 μm 3-layer IE7/IE6/IE7

| | | |
|---|---|---|
| TENSILE MODULUS, MD | MPa | 1300 |
| TENSILE STRENGTH MD | MPa | 18.6 |
| TENSILE STRAIN AT BREAK MD | % | 598.0 |
| Interlayer adhesion | N/cm | Breakage >50 |

The results show that the inventive three-layer element prepared using the polymer composition of the invention has very advantageous mechanical and adhesion properties which are highly suitable for a multilayer element, preferably a backsheet multilayer element, of a photovoltaic module.

PV-Module Example

The protective front glass element, front EVA-encapsulation layer element, photovoltaic cell element together with connectors, back EVA-encapsulation layer element and the 3-layer backsheet of the invention of the above 3-layer examples were assembled in a conventional laminator, heated under vacuum, and then pressed to a PV module in a conventional manner using conventional conditions.

The front glass material, photovoltaic cell element and EVA material of front and back encapsulation (same EVA in both layer elements) were those conventionally used in the PV field.

The invention claimed is:

1. A layer element comprising at least one layer that includes a polypropylene composition (CA), the polypropylene composition (CA) comprising:
5 to 50 wt % of a heterophasic copolymer of propylene (A) which has a Melting temperature (Tm) of at least 145° C. (DSC), and a Vicat softening temperature (Vicat A) of at least 90° C. (according to ASTM D 1525, method A, 50° C./h, 10N), and which comprises
a polypropylene matrix component (a1) and
an elastomeric propylene copolymer component (a2) which is dispersed in said polypropylene matrix (a1), and
20 to 60 wt % of a heterophasic copolymer of propylene (B) which has a Melting temperature (Tm) of at least 145° C. (DSC), and a Vicat softening temperature (Vicat A) of at least 90° C. (according to ASTM D 1525, method A, 50° C./h, 10N), and which comprises:
a polypropylene matrix component (b1) and
an elastomeric propylene copolymer component (b2) which is dispersed in said polypropylene matrix (b1),
10 to 40 wt % of an inorganic filler,
0 to 30 wt % of an plastomer, and
0.3 to 5 wt % of an additive(s) other than the inorganic filler,
based on the total amount (100 wt %) of the polypropylene composition;
wherein the XCS of heterophasic copolymer of propylene (B) is higher than the XCS of heterophasic copolymer of propylene (A).

2. The layer element according to claim 1, wherein the polypropylene composition (CA) has one or more, in any order, of the following features:
a Tensile modulus of at least 900 MPa,
an $MFR_2$ of 1.0 to 25.0, g/10 min, when measured according to ISO 1133 (at 230° C. with 2.16 kg load),
a Vicat softening temperature (Vicat A) of 100 to 200° C.

3. The layer element according to claim 1, wherein the polypropylene composition (CA) comprises:
5 to 50 wt % of the heterophasic copolymer of propylene (A),
25 to 45 wt % of the heterophasic copolymer of propylene (B),
10 to 40 wt % of the inorganic filler,
0 to 30 wt % of a plastomer, and
0.3 to 5 wt % of additives;
based on the total amount (100 wt %) of the polypropylene composition.

4. The layer element according to claim 1, wherein the heterophasic copolymer of propylene (A) of the polypropylene composition (CA) in any order of the following properties:
$MFR_2$ of 0.2 to 15.0 g/10 min when measured according to ISO 1133 (at 230° C. and 2.16 kg load),
Xylene cold soluble (XCS) fraction in amount of 3 to 30 wt,
Comonomer content of 0.5 to 20 wt %
Melting temperature, Tm, of 158 to 170° C.,
Flexural modulus of at least 900 MPa,
Density of 900 to 910 kg/m³, and/or
Vicat softening temperature (Vicat A) of at least 100° C.

5. The layer element according to claim 1, wherein the heterophasic copolymer of propylene (B) of the polypropylene composition (CA) has one or more, in any order of the following properties:
$MFR_2$ of 3.0 to 25.0 g/10 min, when measured according to ISO 1133 (at 230° C. and 2.16 kg load),
Xylene cold soluble (XCS) fraction in amount of 10 to 60 wt %,
Comonomer content of 5.0 to 35 wt %,
Melting temperature, Tm, of 158 to 170° C.,
Flexural modulus of less than 1000 Mpa,
Density of 900 to 910 kg/m³, and/or
Vicat softening temperature (Vicat A) of at least 90° C.

6. The layer element according to claim 1, wherein the layer element, comprises at least one layer which comprises the polypropylene composition (CA); and optionally, at least another layer which comprises the polypropylene composition (CB), which comprises:

0 to 60 wt % of a heterophasic copolymer of propylene (A) which has a Melting temperature (Tm) of at least 145° C. (DSC), and a Vicat softening temperature (Vicat A) of at least 90° C. (according to ASTM D 1525, method A, 50° C./h, 10N), and which comprises:
a polypropylene matrix component (a1) and
an elastomeric propylene copolymer component (a2) which is dispersed in said polypropylene matrix (a1), and 15 to 85 wt % of a heterophasic copolymer of propylene (B) which has a Melting temperature (Tm) of at least 145° C. (DSC), and a Vicat softening temperature (Vicat A) of at least 90° C. (according to ASTM D 1525, method A, 50° C./h, 10N), and which comprises
a polypropylene matrix component (b1) and
an elastomeric propylene copolymer component (b2) which is dispersed in said polypropylene matrix (b1), 15 to 45 wt % of an inorganic filler,
0 to 30 wt % of an adhesive polymer,
0 to 30 wt % of a plastomer, and
0.3 to 5.0 wt % of an additive(s) other than the inorganic filler;

based on the total amount (100 wt %) of the polypropylene composition;

wherein, if the heterophasic copolymer of propylene (A) is present, then the XCS of heterophasic copolymer of propylene (B) is higher than the XCS of heterophasic copolymer of propylene (A).

7. The layer element according to claim 6, wherein the layer element is a multilayer element comprising, in the given order, at least first layer/second layer/third layer, wherein at least the first layer comprise(s) the polypropylene composition (CB), and the second layer comprises the polypropylene composition (CA).

8. The layer element according to claim 6, which is a layer element of an article, comprising, in the given order, at least first layer/second layer/third layer.

9. The layer element according to claim 6, wherein the polypropylene composition (CB) has one or more, in any order, of the following features:
a Tensile modulus of at least 900 MPa,
an $MFR_2$ of 1.0 to 25.0, g/10 min, when measured according to ISO 1133 (at 230° C. with 2.16 kg load),
a Vicat softening temperature (Vicat A) of 100 to 200° C.

10. The layer element according to claim 6, wherein the polypropylene composition (CB) comprises:
0 to 60 wt % of the heterophasic copolymer of propylene (A),
15 to 60 wt % of the heterophasic copolymer of propylene (B),
15 to 45 wt % of the inorganic filler,
0 to 30 wt % of an adhesive polymer,
0 to 30 wt % of a plastomer, and
0.3 to 5.0 wt % of additives;
based on the total amount (100 wt %) of the polypropylene composition.

11. The layer element according to claim 6, wherein the heterophasic copolymer (A) of the polypropylene composition (CB) has one or more, in any order, of the following features:
$MFR_2$ of 0.2 to 15.0 g/10 min when measured according to ISO 1133 (at 230° C. and 2.16 kg load),
Xylene cold soluble (XCS) fraction in amount of 3 to 30 wt,
Comonomer content of 0.5 to 20 wt %
Melting temperature, Tm, of 158 to 170° C.,
Flexural modulus of at least 900 MPa,
Density of 900 to 910 kg/m$^3$, and/or
Vicat softening temperature (Vicat A) of at least 100° C.

12. The layer element according to claim 6, wherein the heterophasic copolymer (B) of the polypropylene composition (CB) has one or more, in any order, of the following properties:
$MFR_2$ of 3.0 to 25.0 g/10 min, when measured according to ISO 1133 (at 230° C. and 2.16 kg load),
Xylene cold soluble (XCS) fraction in amount of 10 to 60 wt %,
Comonomer content of 5.0 to 35 wt %,
Melting temperature, Tm, of 158 to 170° C.,
Flexural modulus of less than 1000 Mpa,
Density of 900 to 910 kg/m$^3$, and/or
Vicat softening temperature (Vicat A) of at least 90° C.

* * * * *